US010135407B1

(12) United States Patent
Chin et al.

(10) Patent No.: US 10,135,407 B1
(45) Date of Patent: Nov. 20, 2018

(54) HIGH EFFICIENCY TRANSMIT-RECEIVE SWITCHES

(71) Applicant: LoJack Corporation, Canton, MA (US)

(72) Inventors: Edmund Chin, Canton, MA (US); Harold Allan Simpson, Canton, MA (US)

(73) Assignee: LoJack Corporation, Canton, MA (US)

( * ) Notice: Subject to any disclaimer, the term of this patent is extended or adjusted under 35 U.S.C. 154(b) by 0 days.

(21) Appl. No.: 15/642,214

(22) Filed: Jul. 5, 2017

(51) Int. Cl.
H04B 1/44 (2006.01)
H03F 3/193 (2006.01)
H03F 1/02 (2006.01)
H03F 3/21 (2006.01)

(52) U.S. Cl.
CPC ........... H03F 3/193 (2013.01); H03F 1/0244 (2013.01); H03F 3/21 (2013.01); H03F 2200/315 (2013.01); H03F 2200/451 (2013.01)

(58) Field of Classification Search
CPC ............... H03F 3/193; H03F 2200/451; H03F 2200/315
USPC .......................................................... 455/78
See application file for complete search history.

(56) References Cited

U.S. PATENT DOCUMENTS

| 6,192,760 B1 | 2/2001 | MacLauchlan et al. |
| 2004/0189265 A1 | 9/2004 | Rice et al. |
| 2005/0154300 A1 | 7/2005 | Wodnicki et al. |
| 2005/0255810 A1* | 11/2005 | Monroe ............ H01P 1/15 455/78 |
| 2009/0033547 A1* | 2/2009 | Kanto ............ G01S 7/034 342/175 |
| 2009/0051338 A1 | 2/2009 | Wang et al. |
| 2010/0001351 A1 | 1/2010 | Zhang et al. |
| 2011/0204821 A1 | 8/2011 | Holmes et al. |
| 2011/0316540 A1 | 12/2011 | Price |
| 2012/0129468 A1 | 5/2012 | Maimon et al. |
| 2012/0295559 A1 | 11/2012 | Kwok et al. |
| 2014/0159831 A1 | 6/2014 | van Wanum |
| 2015/0123554 A1 | 5/2015 | Dellacorna et al. |
| 2015/0222197 A1 | 8/2015 | De Vaal |

FOREIGN PATENT DOCUMENTS

| EP | 0271969 A2 | 6/1988 |
| WO | 2013117034 A1 | 8/2013 |

* cited by examiner

Primary Examiner — Ayodeji Ayotunde
(74) Attorney, Agent, or Firm — KPPB LLP

(57) ABSTRACT

High efficiency transmit-receive switches in accordance with embodiments of the invention are disclosed. In one embodiment, a high efficiency transmit receive switch includes a power input coupled to a power supply, an amplifier output port and a transmit switch input port coupled to a circulator, a received signal circuit port coupled to a first PIN diode coupled to a second PIN diode via a first transmission line and spaced a fractional wavelength apart, the transmit switch input port is coupled to a third PIN diode coupled to a harmonic filter, a second transmission line coupled between the second PIN diode and to the third PIN diode, spaced a fractional wavelength apart, the transmit circuit signal port is coupled to an amplifier, the amplifier is coupled to the amplifier output port, the second transmission line is coupled to the bias current generator coupled to the output port.

15 Claims, 4 Drawing Sheets

US 10,135,407 B1

HIGH EFFICIENCY TRANSMIT-RECEIVE SWITCHES

FIELD OF THE INVENTION

The present invention relates to transmit-receive switches and more specifically to transmit-receive switches employed in power amplifiers.

BACKGROUND

An amplifier is a device designed to increase the power of an input signal by controlling the output of the amplifier to match the shape of the input signal. Typically, an amplifier modulates the output of a power supply based on the input signal, thereby outputting a signal that has the same waveform of the input signal but at a higher amplitude. A radio frequency (RF) power amplifier is a type of amplifier that converts a low-power RF signal into a higher power RF signal, typically used to drive an antenna to transmit the higher power RF signal.

SUMMARY OF THE INVENTION

High efficiency transmit-receive switches in accordance with embodiments of the invention are disclosed. In one embodiment, a high efficiency transmit receive switch includes a transmit switch input port, a power input, an amplifier output port, a transmit switch input port, a transmit signal circuit port, a first transmission line, a second transmission line, a bias current generator, an output port, a received signal circuit port, and a circulator, where the power input is coupled to a power supply, the amplifier output port and the transmit switch input port are coupled to the circulator, the received signal circuit port is coupled to a first PIN diode, the first PIN diode is coupled to a second PIN diode via a first transmission line, the first PIN diode and second PIN diode are spaced a fractional wavelength apart, the transmit switch input port is coupled to a third PIN diode, the third PIN diode is coupled to a harmonic filter, the second transmission line is coupled between the first PIN diode and the second PIN diode and is coupled to the third PIN diode, the second PIN diode and the third PIN diode are spaced a fractional wavelength apart, the transmit circuit signal port is coupled to an amplifier, the amplifier is coupled to the amplifier output port, the second transmission line is coupled to the bias current generator, the bias current generator is decoupled from a harmonic filter by a dc blocking capacitor, and the harmonic filter is coupled to the output port.

In an additional embodiment of the invention, the circulator is further coupled to a load.

In another embodiment of the invention, the circulator dissipates energy received via the amplifier output port using the load.

In yet another additional embodiment of the invention, the fractional wavelength is a one-quarter fractional wavelength.

In still another additional embodiment of the invention, the fractional wavelength is a three-quarter fractional wavelength.

In yet still another additional embodiment of the invention, the first transmission line and the second transmission line are of equal length.

In yet another embodiment of the invention, the amplifier includes a laterally diffused metal oxide semiconductor amplifier.

In still another embodiment of the invention, the output port is coupled to a filter.

In yet still another embodiment of the invention, the output port is coupled to a lightning arrestor.

In yet another additional embodiment of the invention, the power supply provides 48V DC.

In still another additional embodiment of the invention, the bias current generator provides 0.8 amps of current.

In yet still another additional embodiment of the invention, the bias current generator is coupled to a decoupling capacitor and a RF choke and the RF choke is coupled to the third PIN diode.

In yet another embodiment of the invention, the RF choke includes at least one inductor.

In still another embodiment of the invention, the first PIN diode has a lower power rating than the second PIN diode.

In yet still another embodiment of the invention, the first PIN diode has a power rating that is −20 dB lower than the second PIN diode.

Other objects, advantages and novel features, and further scope of applicability of the present invention will be set forth in part in the detailed description to follow, and in part will become apparent to those skilled in the art upon examination of the following, or may be learned by practice of the invention. The objects and advantages of the invention may be realized and attained by means of the instrumentalities and combinations particularly pointed out in the prepended claims.

BRIEF DESCRIPTION OF THE DRAWINGS

The description will be more fully understood with reference to the following figures, which are presented as exemplary embodiments of the invention and should not be construed as a complete recitation of the scope of the invention, wherein.

DETAILED DESCRIPTION

Figure 1:
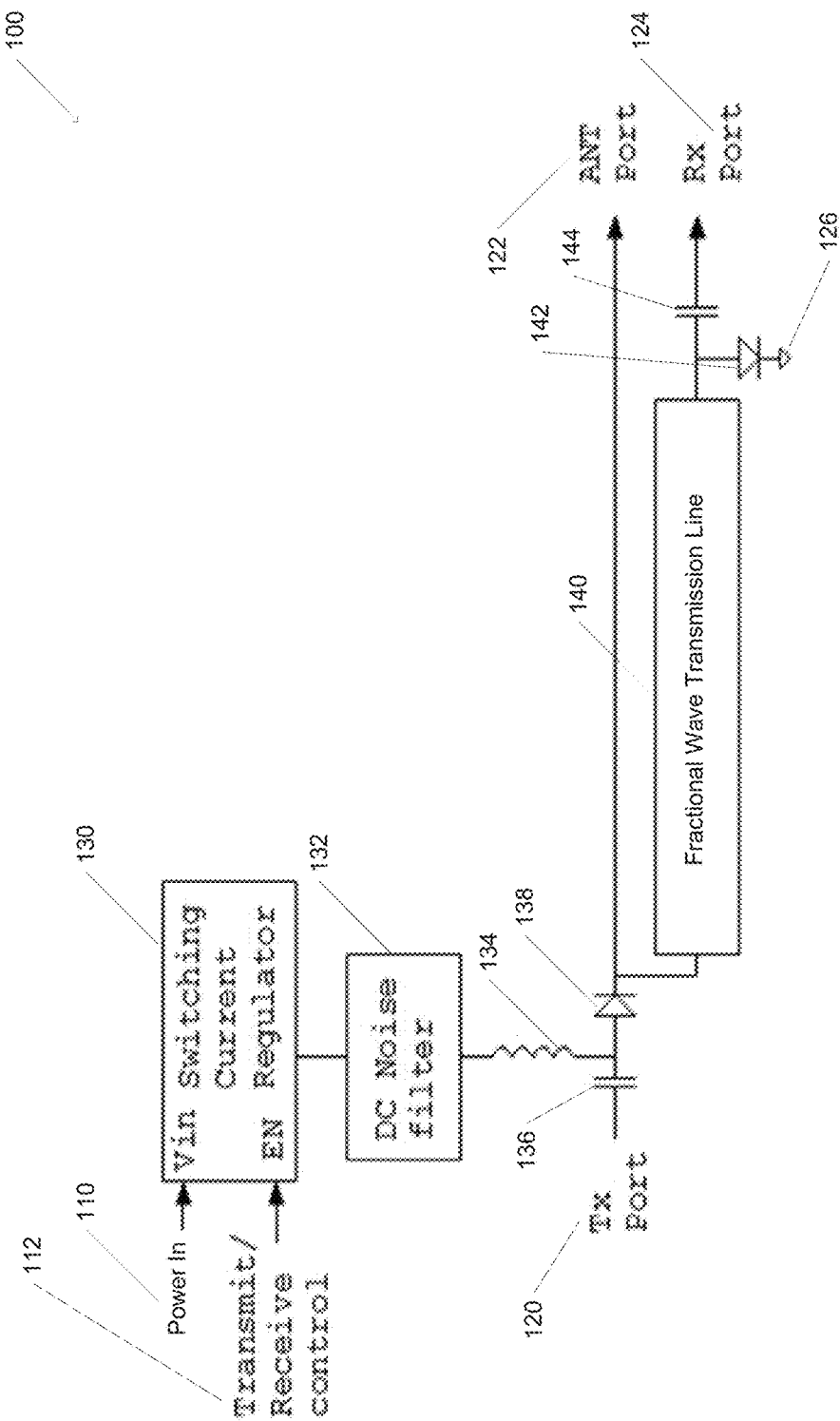
FIG. 1 is a conceptual illustration of an overview of high efficiency transmit-receive switch in accordance with an embodiment of the invention.

Turning now to the drawings, high efficiency transmit-receive (HETR) switches in accordance with embodiments of the invention are disclosed. Transmit/receive (TR) switches are typically used in radio frequency (RF) amplifiers to couple an antenna to the transmitter and receiver of the amplifier so that when transmitting (i.e. during a transmit state), the majority of the transmitter power goes to the antenna and when receiving (i.e. during a receive state), the majority of the signal received by the antenna goes to the receiver. TR switches can also protect the receiver circuitry from being damaged by the transmitter signals by limiting the power that can be applied to the receiver. TR switches typically utilize one or more resistors to bias the diodes from a power supply, resulting in significant power being dissipated in these resistors when the PIN diode operating currents are high to support switching high power levels.

Amplifiers generate heat as they dissipate power, this heat is typically moved away from the amplifier using mechanical systems such as fans and heatsinks. This can lead to a variety of performance issues, such as increased power consumption (to power active cooling elements) and reduced performance in closed and/or hot environments. Additionally, many TR switches require the use of multiple voltage regulators to manage the power and heat generated.

HETR switches in accordance with embodiments of the invention are capable of operating at much wider voltage ranges than prior art TR switches, thereby resulting in efficient operation in a wide variety of environments without the need for extensive mechanical systems to dissipate power. Although HETR switches are capable of operating at any voltage in accordance with applications of embodiments of the invention, power supplies supplying 12V are commonly utilized. In a number of embodiments, HETR switches utilize approximately 1.5 W of power to drive the transmitter and receiver of a RF amplifier, whereas the prior art TR switches commonly utilize 12 W of power. HETR switches in accordance with embodiments of the invention can utilize a switching mode constant current regulator design to energize the PIN diodes used in the HETR switch in contrast to the prior art TR switches using resistors to set the PIN diode operating current. Additionally, HETR switches can be connected directly to a power supply, eliminating an intermediate switching regulator that would have been present to power a prior art TR switch. This direct connection reduces the overall power dissipation in the HETR switch and the overall RF power amplifier. Furthermore, prior art TR switches are generally incapable of operating at a wide variety of voltages are due to the high power dissipation of the resistors and/or regulators used to set bias levels. HETR switches in accordance with embodiments of the invention are capable of operating at a wide variety of voltages with power levels determined by the diode current requirements to switch the RF power levels. In many embodiments, HETR switches can be programmed to supply the optimal current for the diodes based on the transmitter power that will be passed through the HETR switch.

One application that can benefit from the use of HETR switches is stolen vehicle recovery systems. Stolen vehicle recovery systems commonly include one or more locating units installed within a vehicle that communicate with a network of communication towers. Systems and methods for stolen vehicle recovery systems that can be utilized in accordance with embodiments of the invention are described in U.S. Pat. No. 8,013,735, issued Sep. 6, 2011 and U.S. Pat. No. 9,088,398, issued Jul. 21, 2015. In addition to the network of communication towers, vehicle tracking units, stolen vehicle recovery systems can include a network center with a database of customers who have purchased locating units. When the network center is notified that a vehicle has been stolen, the network center causes the communication towers to transmit a message; this message activates the locating unit installed in the vehicle. The activated locating unit broadcasts a signal that can be detected by the vehicle tracking units that can then locate the vehicle and effect its recovery. Systems and methods for synchronizing communications in a stolen vehicle recovery system that can be used in accordance with embodiments of the invention are disclosed in U.S. Pat. No. 8,630,605, issued Jan. 14, 2014. In many vehicle recovery systems, the locating units installed in vehicles that have not been stolen can, on receiving a signal that a vehicle has been stolen, repeat the signal broadcasted by the communication towers. This repeating action can be utilized to increase the coverage area of the vehicle locating system. Systems and methods for stolen vehicle recovery systems that can be utilized in accordance with embodiments of the invention are described in U.S. Pat. No. 8,787,823, issued Jul. 22, 2014. The disclosures of U.S. Pat. Nos. 8,013,735, 8,630,605, 8,787,823, and 9,088,398 are hereby incorporated by reference in their entirety.

Additional details regarding the design and application of HETR switches in accordance with embodiments of the invention are described in more detail below.

HETR Overview

HETR switches can be integrated into a variety of circuits and devices. In a variety of embodiments, a HETR switch is implemented on a microchip as a solid-state device; examples of microchips that are suitable for this purpose are described in more detail below. In many embodiments, the HETR switch circuity is located in a housing. This housing can then be installed in a variety of applications, such as in a rack-mounted unit. Regardless of implementation, a HETR switch can be connected to a variety of external devices. These external devices include, but are not limited to, power supply units, antennas, transmission lines, receive lines, surge protectors, lightning arrestors, testing devices, and computing devices. However, it should be noted that a HETR switch can be utilized in any application, including those where the HETR switch circuit is integrated directly, requiring a low voltage, heat efficient transmit-receive switch as appropriate to the requirements of specific applications of embodiments of the invention.

Turning now to FIG. 1, a conceptual overview of a HETR switch in accordance with embodiments of the invention is shown. The HETR switch 110 includes a power source 110 and a transmit/receive control signal source 112 connected to a switching current regulator 130. In many embodiments, the power source 110 provides 48V to the switching current regulator 130. The output of the switching current regulator 130 is connected to a noise filter 132. In a variety of embodiments, noise filter 132 are applied to the bias current from the switching current regulator 130 to remove or suppress AC noise components to a sufficiently low level. RF choke 134 can impede any high frequency components in the DC bias power to the PIN diodes as well as preventing RF power from the power amplifier from flowing in the reverse direction back into the bias source (i.e. switching current regulator 130). The noise filter 132 can include, but is not limited to, an alternating current (AC) noise filter and/or a direct current (DC) noise filter as appropriate to the requirements of specific applications of embodiments of the invention.

The HETR switch 110 further includes a transmit signal port 120 connected to a capacitor 136 and a PIN diode 138. In the illustrated embodiment, the output of the noise filter 132 is connected between the capacitor 136 and the PIN diode 138 via a RF choke 134. However, it should be noted that the noise filter 134 can be coupled directly and/or using any of a variety of electronic components, such as an inductor, in accordance with embodiments of the invention. The PIN diode 138 is coupled to an antenna port 122 and a fractional wave transmission line 140. The fractional wave transmission line 140 can be tuned to any frequency, including those described in more detail below, as appropriate to the requirements of specific applications of embodiments of the invention. In a number of embodiments, the fractional wave transmission line 140 is an odd quarter length multiple of the desired frequency. The fractional wave transmission line 140 is coupled to a DC blocking capacitor 144 that is coupled to a receive signal port 124. The fractional wave transmission line 140 is also coupled to a PIN diode 142 that is coupled to ground 126. In a variety of embodiments, when PIN diode 142 is forward-biased it appears as a low value resistor shunting the transmission line and attenuates the level (and even both polarities) of signals by an equal amount. This is in contrast to an ordinary diode which has a threshold action that operates only on spikes above a particular level. In many embodiments, the effective resistance of the PIN diode 142 when forward biased is controlled by the level of forward bias current and in general, higher current results in lower resistance resulting in greater attenuation to the signal on the transmission line in this shunting case. For example, the forward bias of PIN diode 142 can effectively ground the end of transmission line 140 when HETR switch 110 is in a transmit state, thereby transforming transmission line 140 to an open circuit at the end having PIN diode 138. This provides a minimal dissipation of power flow (i.e. a dissipation of power below a threshold value) from the transmit signal port 120 to the antenna port 122.

Although a specific embodiment of a HETR switch is described above with respect to FIG. 1, it should be noted that a variety of other embodiments, including those that operate at voltages higher or lower than 48V, can be utilized in accordance with embodiments of the invention.

HETR Switches

As described above, HETR switches can be used to route signals from a transmitter to an antenna and from the antenna to a receiver without allowing signals to pass directly from the transmitter to the receiver. That is, a HETR switch can be in a receive state or a transmit state. In the receive state, the receive circuit of the HETR switch is active and the HETR switch allows signals from an antenna to be received and conveyed via a received signal circuit port to another device and/or circuit. In many embodiments, one or more PIN diodes are in a high impedance state, thereby presenting a small shunt capacitance. In a variety of embodiments, a PIN diode can be placed across a line in a high impedance state by providing no forward DC bias current to the PIN diode. In this way, a low loss path can be provided in the HETR circuit for receiving signals via the receive circuit. In the transmit state, the transmit path of the HETR switch is active and allows a signal to be provided to the antenna to be transmitted. In many embodiments, the antenna is connected to a separate circuit and the HETR switch provides the signal to be transmitted to that circuit via a transmit signal circuit port. In several embodiments, one or more of the PIN diodes in the HETR switch is set to a low impedance state, thereby providing a low loss path in the HETR circuit for transmitting signals via the transmit circuit. That is, the forward bias of the PIN diodes is used to switch the routing of signals between the transmit circuit and the receive circuit. By lowering the impedance of the desired circuit (and raising the impedance of the undesired circuit) during a particular transmit (or receive) state, the high impedance circuit is protected during the state as the signals will naturally propagate through the lower impedance circuit. In a number of embodiments, approximately 0.8 amps of DC current is sufficient to bias one or more PIN diodes to handle several hundred watts of transmit RF power. In a variety of embodiment, the appropriate forward bias current is chosen to produce a sufficiently low effective resistance of the PIN diode(s) so that the RF power dissipated in the PIN diode(s) is sufficiently low to achieve the desired transmit efficiency of the switch and also to assure that the dissipation within the PIN diode(s) in transmit state does not overheat the PIN diode(s). The optimum bias current varies over an appreciable range depending upon the RF power level to be handled and the specific PIN diode chosen as appropriate to the requirements of specific applications of embodiments of the invention.

In many embodiments, one or more of the PIN diodes are coupled together using a line that is a fractional wavelength of the intended transmit and/or receive frequency. In a variety of embodiments, the fractional wavelength is a quarter wavelength. Quarter wavelength lines between the PIN diodes are particularly useful in HETR switches as it both provides minimal disturbance to the impedance of any filtering devices present in the circuit. Similarly, at twice the desired frequency, these lines are a half wavelength long, adding a loss peak in the filter characteristic at the second harmonic of the transmit frequency. This loss peak can improve the filtering action of the filtering devices.

HETR switches in accordance with embodiments of the invention can also utilize a two-stage design. In a variety of embodiments, the second stage of a two-stage HETR switch includes an additional PIN diode placed in shunt across the transmission line going toward the receiver and spaced a fractional wavelength from the first PIN diode of the HETR switch. The additional PIN diode can be placed in a low impedance state by forward biasing the additional PIN diode at the same time the first PIN diode is forward biased when the HETR switch is in the transmit state. This adds an additional shunt impedance across the receive line and increases the isolation from the transmit signal circuit port to the receiver signal circuit port during transmission so the receiver circuit is impacted with less RF energy when the transmit circuit is on. This prevents burning out the receiver circuits and decreases the amount of time for the receiver circuit to recover from any overload that might occur during the transmission state. In a variety of embodiments, the PIN diodes are spaced a quarter wavelength apart. In several embodiments, a quarter wavelength spacing of the diodes maximizes the effect of the additional PIN diode in providing additional loss in that path.

Figure 2:
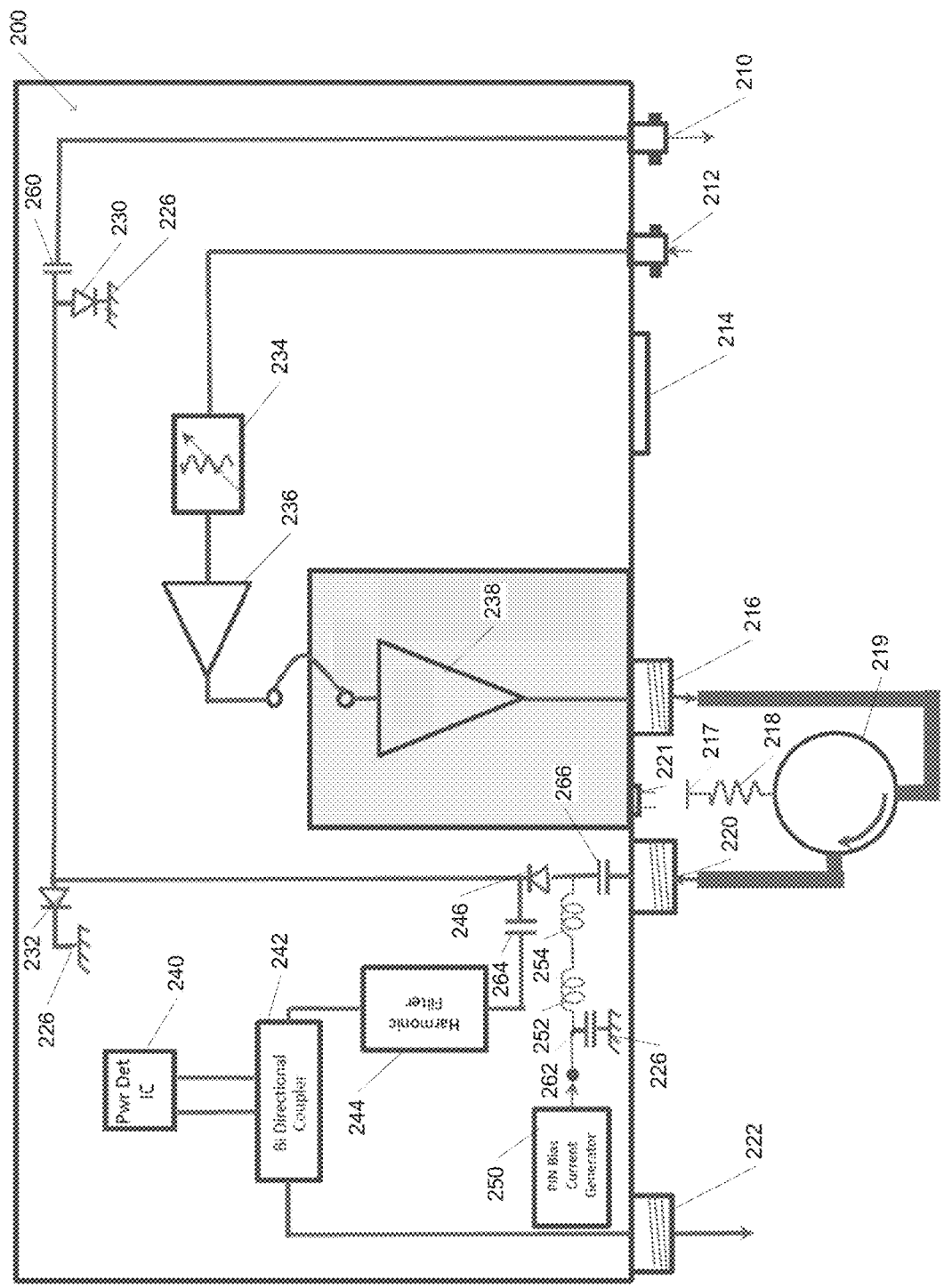
FIG. 2 is a conceptual illustration of a high efficiency transmit/receive switch in accordance with an embodiment of the invention.

Turning now to FIG. 2, a HETR switch in accordance with an embodiment of the invention is shown. The HETR switch 200 includes received signal circuit port 210, transmit signal circuit port 212, serial connector 214, amplifier output port 216, ground 217, transmit switch input port 220, power input 221, and output port 222. Power input 221 can be utilized to connect HETR switch 200 to a power supply. In many embodiments, the power supply 217 provides 48V of electricity, although any voltage can be provided (both AC and DC) as appropriate to the requirements of specific applications of embodiments of the invention. In the illustrated embodiment, amplifier output port 216 is coupled to circulator 219; circulator 219 also being coupled to transmit switch input port 220 and ground 217 via a load (resistor) 218. Received signal circuit port 210 is coupled to a capacitor 260 that is coupled to a first PIN diode 230 that is coupled to a second PIN diode 232. Both first PIN diode 230 and second PIN diode 232 are coupled to chassis ground 226. In many embodiments, the PIN diodes 230 and 232 are spaced an odd multiple of one-quarter wavelength apart. Transmit switch input port 220 is coupled to a capacitor 266 that is coupled to PIN diode 246, which is coupled to a capacitor 264 that is coupled to harmonic filter 244. In many embodiments, capacitor 264 decouples harmonic filter 244 from the bias current generator 250 so that the bias current is not present in portions of the circuit where it is not desired. In the illustrated embodiment, a transmission line exists between PIN diode 230 and PIN diode 232 such that it is coupled between PIN diode 246 and capacitor 264. In a number of embodiments, this transmission line is a fractional wavelength of the intended receive and/or transmit frequency. In a number of embodiments, capacitors 260 and/or 266 can be used as DC blocking capacitors.

In HETR switch 200, harmonic filter 244 is coupled to bi-directional coupler 242 that is coupled to power detector circuit 240. Bi-directional coupler 242 is also coupled to output port 222. In a variety of embodiments, the output port 222 can be coupled to a filter and/or a lightning arrestor. Transmit signal circuit port 212 is coupled to variable attenuator 234, which is coupled to amplifier 236. Amplifier 236 is coupled to a second amplifier 238 that is coupled to amplifier output port 216. In several embodiments, amplifier 238 is a laterally diffused metal oxide semiconductor (LDMOS) amplifier. In many embodiments, circulator 219 and load 218 constitute an isolator. RF energy from amplifier output port 216 can conveyed (with low loss) to transmit switch input port 220. Power reflected and/or emanating through transmit switch input port 220 toward circulator 219 can dissipated by load 218, thereby protecting the output from amplifier 238. In many embodiments, PIN diode 246 will be essentially transparent (i.e. appears as a low value resistor) when HETR switch 200 is in a transmit state. Reflected power that is directed toward the output of the amplifier can be caused by an impedance mismatch at the load. The circulator 219 can protect the amplifier from receiving this reflected power by diverting power flowing in that direction to the load 218. Another function of the circulator 219 is to prevent RF signals picked by the antenna from impinging upon the output of the power amplifier. These signals, if of sufficient magnitude, can produce additional interfering frequencies by the phenomenon of intermodulation distortion caused by non-linear effects in the output stage of the amplifier. These interfering signals can then travel back up the transmission line to the antenna where they are radiated and create interference particularly to other services co-located at the same site unless redirected by the circulator 219.

HETR switch 200 further includes PIN bias current generator 250 coupled to decoupling capacitor 262 that is coupled to chassis ground 226. In several embodiments, capacitor 262 is used as an RF bypass for the PIN bias circuit. PIN bias current generator 250 is also coupled to inductor 252 that is coupled to inductor 254; these inductors can be used as an RF choke. Inductor 254 is coupled between capacitor 266 and PIN diode 246. In several embodiments, inductors 252 and 254 can be replaced with a single inductor or any other RF choke as appropriate to the requirements of specific applications of embodiments of the invention. In many embodiments, the PIN bias current generator generates 0.8 amps of current that is used to forward bias one or more of the PIN diodes. It should be noted, however, that the power used to forward bias the PIN does can depend on the RF power level and/or the PIN diodes utilized as appropriate to the requirements of specific applications of embodiments of the invention.

In a variety of embodiments, the circuit between transmit switch input port 220 and output port 222 can be considered the transmit path of HETR switch 200. Similarly, the circuit between output port 222 and received signal circuit port 210 can be considered the receive path of HETR switch 200. In several embodiments, the quarter wavelength line between PIN diode 246 and PIN diode 232 transforms the short circuit at PIN diode 232 when the HETR switch 200 is in a transmit state to an open circuit at the junction of PIN diode 246 and the harmonic filter 244, thereby providing minimal disturbance to the input impedance of the harmonic filter 244 in the pass band facilitating power flow toward the harmonic filter 244. In many embodiments, when HETR switch 200 is in a receive state the loss between transmit switch input port 220 and received signal circuit port 210 is high because PIN diode 246 is not forward biased. In a number of embodiments, the harmonic filter 244 has an impedance of 50 ohms. In a variety of embodiments, when the HETR switch 200 is in a receive state, the bias current is off and all of the PIN diodes are in a high-impedance state. In many embodiments, when HETR switch 200 is in a transmit state, the forward DC bias current flows through the parallel combination of PIN diode 232 and PIN diode 230 such that PIN diode 232 returns most of the forward DC bias current to ground and PIN diode 230 returns the smaller remaining portion of the forward DC bias current to ground. In a variety of embodiments, PIN diode 230 has a lower power rating than PIN diode 232 due to the lower RF power impinging upon it. In many embodiments, much of the transmit energy is reflected by PIN diode 230 when HETR switch 200 is in a transmit state. Accordingly, a lower amount of transmit energy impinges on PIN diode 230, therefore PIN diode 230 can utilize a device of a lower power rating than PIN diode 230. In several embodiments, PIN diode 230 has a rating 20 dB lower than PIN diode 232, although a variety of relative power ratings for the PIN diodes can be utilized as appropriate to the requirements of specific applications of embodiments of the invention.

Specific embodiments of HETR switches in accordance with embodiments of the invention are described above with respect to FIG. 2; however, it should be noted that a variety of other embodiments, including those that operate at voltages higher or lower than 48V and those where one or more of the PIN diodes are oriented in a different manner (or replaced with a set of PIN diodes in series and/or parallel), can be utilized in accordance with embodiments of the invention.

Wavelengths and Spacing

As described above, HETR switches can be employed in a variety of applications that transmit and receive signals at a variety of frequencies. For a given frequency, a HETR switch can include one or more elements spaced apart based on the intended wavelength of signal to be transmitted and/or received. In many embodiments, three-quarter wavelengths and/or one-quarter wavelengths are used, although a variety of fractional wavelengths, particularly odd multiples of a one-quarter wavelength, can be utilized as appropriate to the requirements of specific applications of embodiments of the invention. The following table provides a summary of common frequencies utilized in accordance with embodiments of the invention along with the approximate length for the inner and outer elements for three quarter-wavelengths and one quarter-wavelengths:

| Frequency | ¾ Wavelength | ¼ Wavelength |
|---|---|---|
| 173 MHz | 0.618 meters | 0.206 meters |
| 700 MHz | 0.153 meters | 0.051 meters |
| 800 MHz | 0.1335 meters | 0.0445 meters |
| 850 MHz | 0.126 meters | 0.042 meters |
| 900 MHz | 0.1185 meters | 0.0395 meters |
| 1176 MHz | 0.0915 meters | 0.0305 meters |
| 1227 MHz | 0.087 meters | 0.029 meters |
| 1500 MHz | 0.072 meters | 0.024 meters |
| 1575 MHz | 0.0675 meters | 0.0225 meters |
| 1700 MHz | 0.063 meters | 0.021 meters |
| 1800 MHz | 0.060 meters | 0.020 meters |

-continued

| Frequency | ¾ Wavelength | ¼ Wavelength |
|---|---|---|
| 1900 MHz | 0.057 meters | 0.019 meters |
| 2100 MHz | 0.051 meters | 0.017 meters |
| 2441 MHz | 0.0435 meters | 0.0145 meters |
| 2600 MHz | 0.0405 meters | 0.0135 meters |
| 5437 MHz | 0.0195 meters | 0.0065 meters |

It should be appreciated that the above table is provided as an example only and that other frequencies and component spacing that are substantially similar can be utilized as appropriate to the requirements of specific applications of embodiments of the invention. In a variety of embodiments, the physical length of the transmission line are dependent on the phase velocity of the medium in which the transmission line is constructed. Additionally, any network that simulates an odd multiple of a quarter wavelength transmission line at the frequency of interest is useable as appropriate to the requirements of specific applications of embodiments of the invention. In several embodiments, the odd multiple of 90 degrees of phase shift is supplied by the network where frequently lumped element realizations of low pass filters are used with the cutoff frequency chosen to give the appropriate phase shift, particularly when there may not be enough room to accommodate a physical transmission line of the desired length.

Power Amplifiers

As described above, HETR switches are commonly integrated into RF power amplifiers, where they simplify the design of the power amplifier by reducing the cooling requirements and overall hardware and interconnections necessary to support the transmission and reception of RF signals. In several embodiments, these RF power amplifiers are contained in multiple modules that can be separately developed and installed. RF power amplifiers in accordance with embodiments of the invention can provide a variety of powered RF signals depending on the input voltage and amperage. In a variety of embodiments, RF power amplifiers provide the following output powers: 600 W of power with 48V at 15 Å, 100 W of power with 24V at 6 Å, and 50 W of power with 24V at 4A. In several embodiments, the maximum input voltage is 57V.

Figure 3:
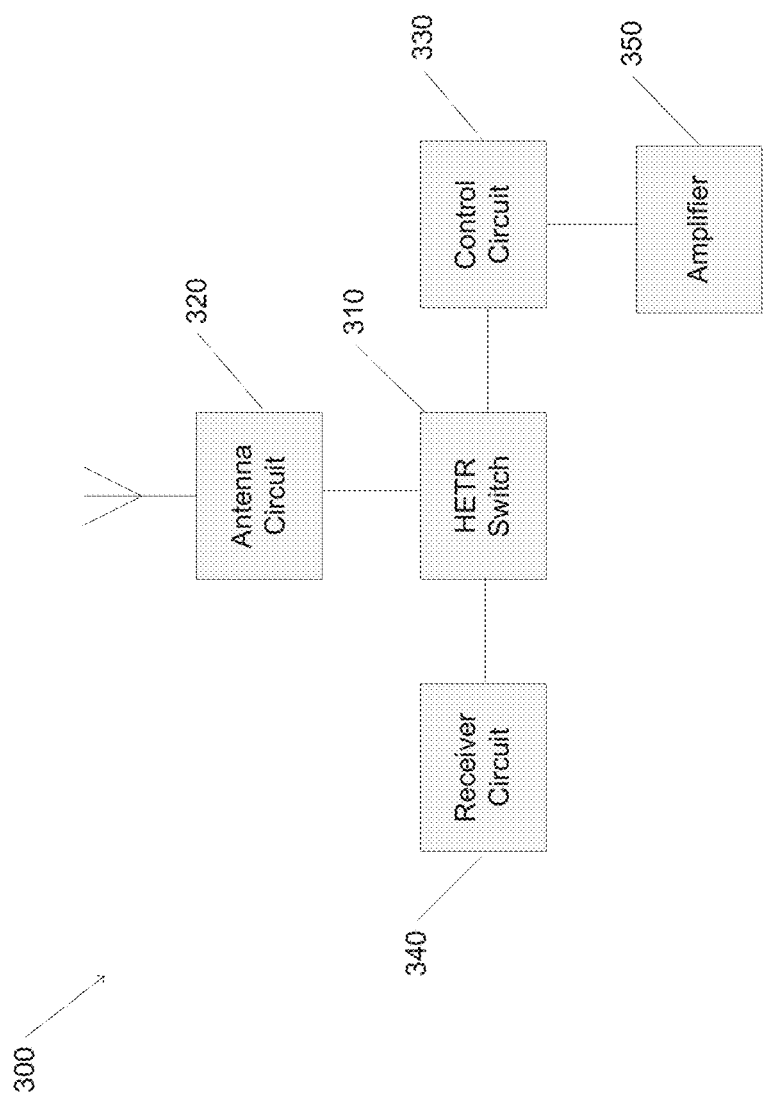
FIG. 3 is a conceptual illustration of a simplified power amplifier utilizing a high efficiency transmit/receive switch in accordance with an embodiment of the invention.

Turning now to FIG. 3, a simplified block diagram of a power amplifier in accordance with an embodiments of the invention is shown. The power amplifier 300 includes a HETR switch 310 connected to an antenna circuit 320, a receiver circuit 340, and a control circuit 340 which is connected to an amplifier 350. As described above, HETR switch 310 can be utilized to dynamically couple the receiver circuit 340 and the control circuit 330 to the antenna circuit 320 during a receive state and a transmit state respectively. While in the receive state, HETR switch 310 protects the control circuit 330 from receiving unexpected signals from the antenna 310 and/or receiver circuit 340. Similarly, during a transmit state, HETR switch 310 protects the receiver circuit 340 from receiving unexpected signals from the antenna 310, control circuit 330, and/or amplifier 350. In this way, the power amplifier 300 can utilize a single amplifier and antenna circuit for both transmitting and receiving signals, thereby reducing the design and hardware requirements necessary to support both receiving and transmitting signals.

Figure 4:
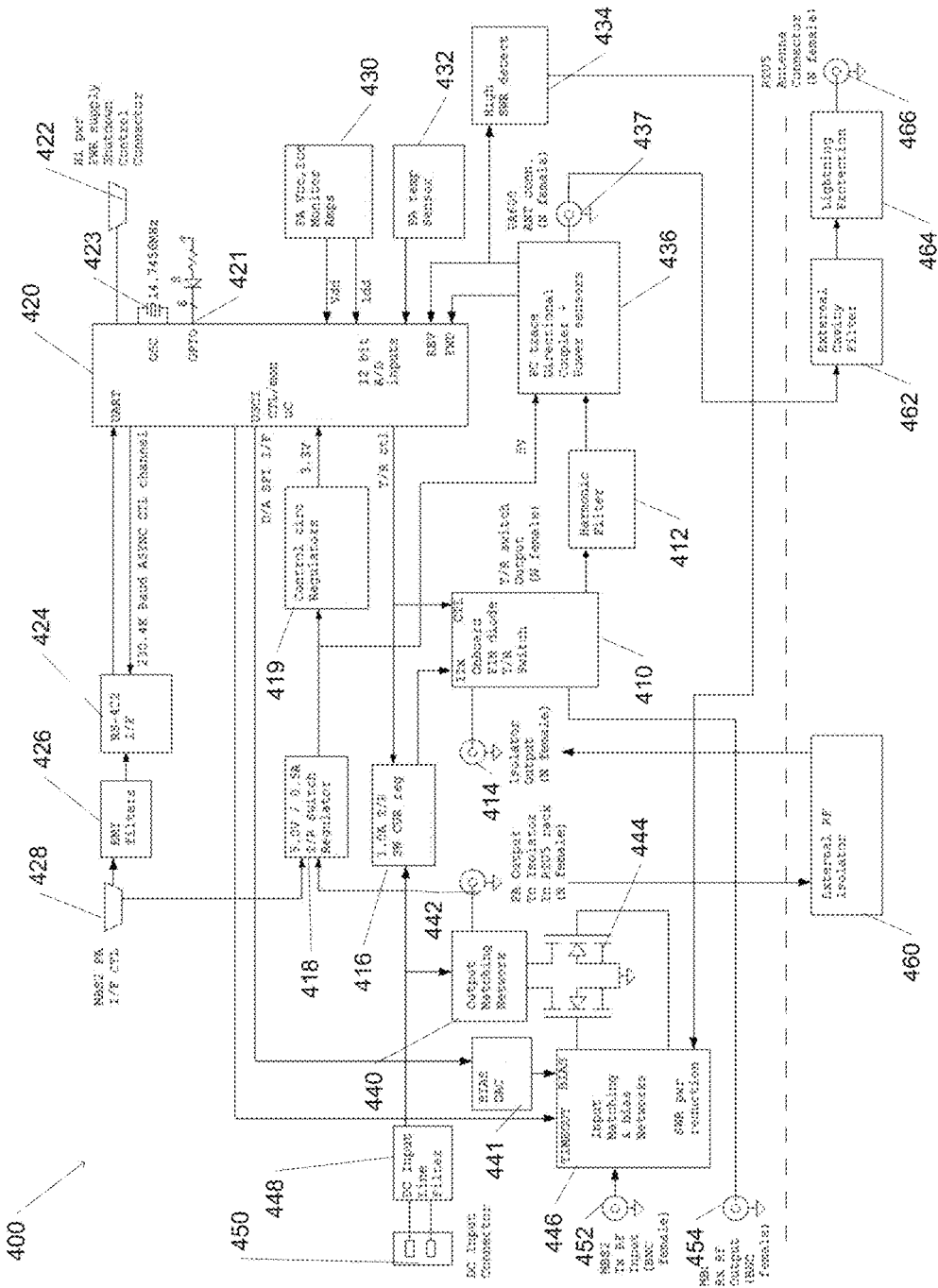
FIG. 4 is a conceptual illustration of a power amplifier utilizing a high efficiency transmit-receive switch in accordance with an embodiment of the invention.

Turning now to FIG. 4, a rack-mounted power amplifier in accordance with an embodiment of the invention is shown. The power amplifier 400 includes a variety of power amplifier components connected to a set of rack-mounted components. The rack-mounted components include a RF isolator 460, cavity filter 462, lightning arrestor 464, and an antenna connector 466. The power amplifier components include HETR switch 410 coupled to harmonic filter 412, isolator output 414 (coupled to RF isolator 460), current regulator 416, receiver output connector 454, and microcontroller 420. In many embodiments, HETR switch 410 is implemented using one or more UM9415 PIN diodes manufactured by Microsemi Corporation of Aliso Viejo, Calif. In a number of embodiments, microcontroller 420 is implemented using a MSP430F532x microcontroller manufactured by Texas Instruments of Dallas, Tex. The microcontroller 420 can provide a signal to the HETR switch and/or current regulator 416 to control the state of the HETR switch, e.g. determining if the switch is in a transmit state or a receive state. Current regulator 416 can be implemented using a Si9407 MOSFET manufactured by Vishay Intertechnology, Inc. of Malvern, Pa. and/or a LM3409 driver provided by Texas Instruments. DC input line filter 448 is also coupled to output matching network 440 that is coupled to power amplifier output connector 442 (that is coupled to RF isolator 460) and transistor 444. In a variety of embodiments, transistor 444 is a 700 W LDMOS transistor manufactured by Ampleon of Nijmegen, Netherlands. Transistor 444 is coupled to input matching network 446 that is coupled to bias DAC (digital-analog converter) 441 (both being coupled to microcontroller 420), standing wave ratio detector 434 (that is coupled to microcontroller 420 and power sensors 436), and transmitter RF input connector 452.

Current regulator 416 is coupled to DC line input filter 448 that includes DC input connector 450. DC line input filter 448 is also coupled to regulator 418. In many embodiments, regulator 418 is a LM2574HV step-down voltage regulator provided by Texas Instruments. Regulator 418 can reduce the input voltage and/or amperage provided by DC line input filter 448 to a level usable by the other components of power amplifier 400. In a variety of embodiments, regulator 418 outputs 5V at 0.5 Å. Regulator 418 is further coupled to control circuit regulator 419 and power sensors 436. Power sensors 436 are also coupled to harmonic filter 412 and microcontroller 420. In many embodiments, control circuit regulator 419 is implemented using a MCP1700T voltage regulator and/or a TC 7660H charge pump voltage converter, both manufactured by Microchip Technology of Chandler, Ariz. Control circuit regulator 419 can provide power to microcontroller 420 at any voltage, including 3.3V, as appropriate to the requirements of specific applications of embodiments of the invention. Power sensors 436 are coupled to antenna connector 437 (coupled to cavity filter 462) and can be implemented using an AD8364 power detector manufactured by Analog Devices of Cambridge, Mass.

Microcontroller 420 is further coupled to a clock source 423. In the illustrated embodiment, clock source 423 is operating at 14.7456 MHz, although any frequency can be utilized as appropriate to the requirements of specific applications of embodiments of the invention. Microcontroller 420 also provides general-purpose input-output (GPIO) connector 421 that can be connected to a variety of external devices along with control connector 422. Microcontroller is further coupled to line driver 424 that is coupled to filter 426 that is coupled to power amplifier control connector 428. Power amplifier control connector 428 is further coupled to regulator 418. Control connector 422 and power amplifier control connector 428 can be any serial connection and use any serial connector, such as a DB-9 connector or a universal serial bus connector, as appropriate to the requirements of specific applications of embodiments of the invention. In a number of embodiments, line driver 424 is implemented using a 26LV31 or 26LV32 CMOS quad differential line receiver manufactured by Texas Instruments. In a variety of embodiments, the microcontroller communicates with line driver 424 using a 230.4K baud control channel. In the illustrated embodiment, power amplifier control connector 428 provides a 12V signal to regulator 418. Additionally, microcontroller 420 is coupled to power amplifier monitor 430 and temperature sensor 432. In several embodiments, power amplifier monitor 430 is implemented using an INA168 output current monitor manufactured by Texas Instruments and/or a MCP6071 op amp manufactured by Microchip Technology. In a number of embodiments, temperature sensor 432 can is implemented using a MCP9700A thermistor provided by Microchip Technology.

Power amplifiers in accordance with embodiments of the invention are described above with respect to FIGS. 3 and 4; however, it should be noted that a variety of other embodiments, including those that are not rack mounted, those that connected to more and/or fewer components, and those that utilize devices other than those specifically described above, can be utilized in accordance with embodiments of the invention. Additionally, it should be appreciated that any connector described herein can be any connector as appropriate to the requirements of specific applications of embodiments of the invention, such as Bayonet Neill-Concelman (BNC) connector and Threaded Neill-Concelman (TNC) connector. In several embodiments, a connector includes a mating connector, such that when the connector is engaged with the mating connector an electrical coupling between the connector and the mating connector is established.

Although the present invention has been described in certain specific aspects, many additional modifications and variations would be apparent to those skilled in the art. In particular, any of the various processes described above can be performed in alternative sequences and/or in parallel (on the same or on different devices) in order to achieve similar results in a manner that is more appropriate to the requirements of a specific application. It is therefore to be understood that the present invention can be practiced otherwise than specifically described without departing from the scope and spirit of the present invention. Thus, embodiments of the present invention should be considered in all respects as illustrative and not restrictive. It will be evident to the person skilled in the art to freely combine several or all of the embodiments discussed here as deemed suitable for a specific application of the invention. Throughout this disclosure, terms like "advantageous", "exemplary" or "preferred" indicate elements or dimensions which are particularly suitable (but not essential) to the invention or an embodiment thereof, and may be modified wherever deemed suitable by the skilled person, except where expressly required. Accordingly, the scope of the invention should be determined not by the embodiments illustrated, but by the appended claims and their equivalents.

What is claimed is:

1. A high efficiency transmit receive switch, comprising:
   a transmit switch input port;
   a power input;
   an amplifier output port;
   a transmit switch input port;
   a transmit signal circuit port;
   a first transmission line;
   a second transmission line;
   a bias current generator;
   an output port;
   a received signal circuit port; and
   a circulator;
   wherein:
   the power input is coupled to a power supply;
   the amplifier output port and the transmit switch input port are coupled to the circulator;
   the received signal circuit port is coupled to a first PIN diode;
   the first PIN diode is coupled to a second PIN diode via a first transmission line;
   the first PIN diode and second PIN diode are spaced a fractional wavelength apart;
   the transmit switch input port is coupled to a third PIN diode;
   the third PIN diode is coupled to a harmonic filter;
   the second transmission line is coupled between the first PIN diode and the second PIN diode and is coupled to the third PIN diode;
   the second PIN diode and the third PIN diode are spaced a fractional wavelength apart;
   the transmit circuit signal port is coupled to an amplifier;
   the amplifier is coupled to the amplifier output port;
   the second transmission line is coupled to the bias current generator;
   the bias current generator is decoupled from a harmonic filter by a dc blocking capacitor; and
   the harmonic filter is coupled to the output port.

2. The high efficiency transmit receive switch of claim 1, wherein the circulator is further coupled to a load.

3. The high efficiency transmit receive switch of claim 2, wherein the circulator dissipates energy received via the amplifier output port using the load.

4. The high efficiency transmit receive switch of claim 1, wherein the fractional wavelength is a one-quarter fractional wavelength.

5. The high efficiency transmit receive switch of claim 1, wherein the fractional wavelength is a three-quarter fractional wavelength.

6. The high efficiency transmit receive switch of claim 1, wherein the first transmission line and the second transmission line are of equal length.

7. The high efficiency transmit receive switch of claim 1, wherein the amplifier comprises a laterally diffused metal oxide semiconductor amplifier.

8. The high efficiency transmit receive switch of claim 1, wherein the output port is coupled to a filter.

9. The high efficiency transmit receive switch of claim 1, wherein the output port is coupled to a lightning arrestor.

10. The high efficiency transmit receive switch of claim 1, wherein the power supply provides 48V DC.

11. The high efficiency transmit receive switch of claim 1, wherein the bias current generator provides 0.8 amps of current.

12. The high efficiency transmit receive switch of claim 1, wherein:
   the bias current generator is coupled to a decoupling capacitor and a RF choke; and
   the RF choke is coupled to the third PIN diode.

13. The high efficiency transmit receive switch of claim 12, wherein the RF choke comprises at least one inductor.

14. The high efficiency transmit receive switch of claim 1, wherein the first PIN diode has a lower power rating than the second PIN diode.

15. The high efficiency transmit receive switch of claim 14, wherein the first PIN diode has a power rating that is −20 dB lower than the second PIN diode.

* * * * *